United States Patent
Hadley et al.

[11] Patent Number: 6,061,455
[45] Date of Patent: May 9, 2000

[54] AUDIO SYSTEM

[75] Inventors: Darby Edward Hadley, Novi, Mich.; David John Smart, South Woodham Ferrers, United Kingdom

[73] Assignee: Ford Motor Company, Dearborn, Mich.

[21] Appl. No.: 08/879,479

[22] Filed: Jun. 20, 1997

[30] Foreign Application Priority Data

Jun. 21, 1996 [GB] United Kingdom ............ 9613136

[51] Int. Cl.[7] .................................................. H03G 3/20
[52] U.S. Cl. .......................... 381/57; 381/109; 381/107
[58] Field of Search ......................... 381/57, 104, 109, 381/86, 120, 56, 58, 59, 106, 107, 108, 94.8; 330/254, 278, 279, 129

[56] References Cited

U.S. PATENT DOCUMENTS

| | | | |
|---|---|---|---|
| 4,558,460 | 12/1985 | Tanaka et al. | 381/57 |
| 4,628,526 | 12/1986 | Germer | 381/57 |
| 5,054,078 | 10/1991 | Schorman et al. | 381/57 |
| 5,130,665 | 7/1992 | Walden | 381/109 |
| 5,243,657 | 9/1993 | Cotton | 381/57 |

*Primary Examiner*—Vivian Chang
*Attorney, Agent, or Firm*—Mark Mollon

[57] ABSTRACT

An audio system for a vehicle comprises an audio amplifier 14 and a manually adjustable volume control 18 for setting the output level of the sound generated by a loudspeaker 20 connected to the output of the amplifier 14. The amplifier 14 includes distortion sensing means for detecting when the level of distortion of the output signal of the amplifier 14 exceeds a reference threshold and a control circuit 16 reduces the sound output level of the amplifier in response to a signal from the distortion sensing means. The reference threshold of the distortion sensing means 14 is varied in dependence upon the output level setting of the volume control 18 so that the allowable output distortion can be varied based upon user input.

3 Claims, 1 Drawing Sheet

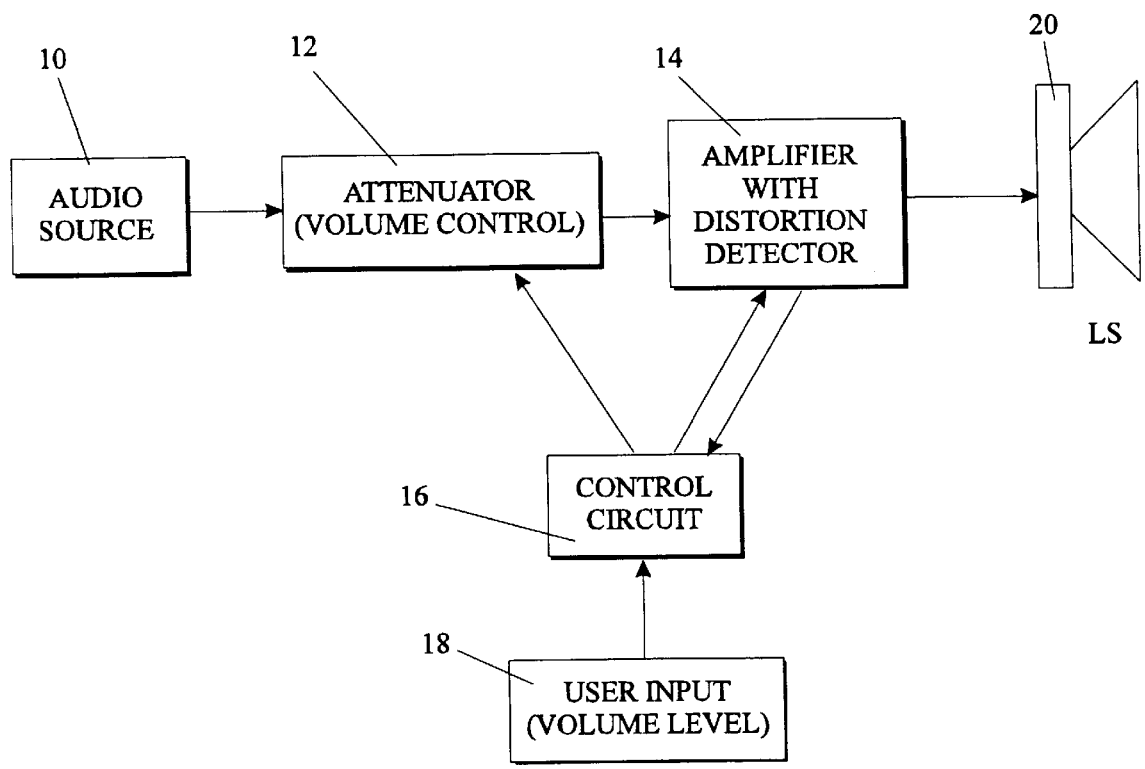

AUDIO SYSTEM

FIELD OF THE INVENTION

The present invention relates to an audio system and is particularly applicable to a vehicle entertainment system.

BACKGROUND OF THE INVENTION

Audio amplifiers tend to distort the audio signal when set at a high output level. Such distortion, apart from creating an unpleasant sound, can cause physical damage to the loudspeakers driven by the amplifier. It has therefore already been proposed to limit the degree of distortion by resorting to volume foldback, in other words the output volume of the audio amplifier is reduced as soon as a predetermined threshold of unacceptable distortion is exceeded.

The distortion threshold that resulted in steps being taken in the prior art to reduce the output volume of the audio amplifier was fixed. Because ideally there should be no distortion at all, it was at first attempted to set a zero level of distortion and any detected distortion resulted in the output level of the audio amplifier being reduced. Surprisingly, the resulting improvement in sound quality was not found universally acceptable because some listeners objected to the reduction in maximum output power. It was found that some listeners were of the opinion that an audio system is under performing if it does not produce distortion at maximum volume, and to meet their needs a certain degree of distortion was not only acceptable but desirable. As a result, a compromise threshold was adopted that allowed some degree of distortion at maximum volume while still reducing the risk of damage to the loudspeakers through clipping of their driving signal.

The disadvantage of such a system is that distortion is tolerated even at volume levels below the maximum and this results in the sound quality at such lower volumes being compromised unnecessarily.

SUMMARY OF THE INVENTION

With a view to mitigating the foregoing disadvantage, the present invention provides an audio system for a vehicle comprising an audio amplifier, a manually adjustable volume control for setting the output level of the sound generated by a loudspeaker connected to the output of the amplifier, distortion sensing means for detecting when the level of distortion of the output signal of the amplifier exceeds a reference threshold and means for reducing the sound output level of the amplifier in response to a signal from the distortion sensing means, characterised in that the reference threshold of the distortion sensing means is varied in dependence upon the output level setting of the volume control.

In the present invention, the distortion sensing means can be set to a very low distortion threshold when the audio amplifier is not operating near its maximum output level so that negligible distortion is allowed over most of the operating range. This meets the needs of discerning listeners who are not willing to sacrifice sound quality for increased output power.

Near the maximum output level setting of the volume control, the reference threshold of the distortion sensing means may be increased to permit some higher level of distortion. Even at the maximum setting of the volume control, the distortion is limited to avoid damage to the connected loudspeakers, by the volume foldback as described above.

The reference threshold of the distortion sensing means may be varied continuously as a function of the volume control setting or in a plurality of steps. In the currently preferred embodiment, the reference threshold can adopt one of only a few values, depending upon where the setting of the volume control is above of below given limits.

BRIEF DESCRIPTION OF THE DRAWINGS

The invention will now be described further, by way of example, with reference to the accompanying drawing in which the single FIGURE is a schematic diagram of a vehicle entertainment system.

DETAILED DESCRIPTION OF THE PREFERRED EMBODIMENT

The output signal from an audio source 10, which may be a radio tuner, a cassette player or a CD player, is applied to an amplifier 14 with a built in distortion detector by way of an attenuator or volume control 12. The amplifier 14 is connected in the usual manner to a loudspeaker 20.

A control circuit 16, which may be a microcontroller, is connected to the amplifier 14 and the attenuator 12 and acts to reduce the set output level of the amplifier 14 when distortion above a reference threshold is detected in the amplifier 14. An input device 18, which may for example be a pair of UP and DOWN buttons, is connected to the control circuit to vary the setting of the attenuator in order to increase and decrease the sound output level.

As so far described the circuits are generally conventional and their construction will be clear to the person skilled in the art without the need for more detailed explanation.

In prior art systems, the reference threshold in the amplifier 14 that sets the maximum amount of distortion that may occur before a signal is sent to the control circuit 16 is fixed. Whichever level of distortion is set as being acceptable will therefore be applied over the entire output level range of the amplifier and distortion can occur even at relatively sound low output levels.

In a typical application of the invention, the control circuit 16 not only receives the signals from the amplifier 14 that indicate that the permitted level of distortion has been exceeded but also sends a signal, which is preferably a digital signal, to set the distortion reference threshold level of the amplifier. The control circuit 16 thereby acts on the distortion sensing means within the amplifier 14 to decrease the threshold of distortion when a low output level is set by the user input 18 and increase the distortion threshold to allow a greater amount of distortion when a higher sound output level is manually selected by the user.

In a simple example, if the sound output level is adjustable on a scale of 1 to 30 as is commonly the case, for as long as the user sets the volume level below 28, the reference threshold of the distortion sensing means within the amplifier 14 is set at zero so that all distortion is eliminated by volume foldback in the manner earlier described. When however the listener sets the volume to a value of 29 or 30, that is to say near to the output level limit of the amplifier, then a higher degree of distortion, say 10% is allowed, before volume foldback occurs to reduce the output level of the amplifier.

By suitable design of the amplifier 14, it is possible to set multiple threshold values, if desired.

The combined amplifier and distortion detector 14 is commonly designed as an integrated circuit and the threshold that sets the permissible level of distortion is determined by a voltage reference within the integrated circuit. Because of the wide tolerances in the manufacture of integrated circuits, it is not practicable to compare an internal voltage of the integrated circuit with an externally applied analogue reference voltage. Instead, it is preferred to provide an internal voltage reference in the integrated circuit in which the reference level can be adjusted by the external control circuit 16.

The manner in which the level of distortion is detected is known in the art and has not therefore been described herein in detail. It may rely on a comparison of the input and output signal of the amplifier or be based on an harmonic analysis of the output signal of the amplifier. The method of detection is not fundamental to the invention. It is only essential in the invention to be able to reduce the permitted distortion limit in dependence upon the manual setting of the volume control.

What is claimed is:

1. An audio system for a vehicle comprising an audio amplifier, a manually adjustable volume control for setting the output level of the sound generated by a loudspeaker connected to the output of the amplifier, distortion sensing means for detecting when the level of distortion of the output signal of the amplifier exceeds a reference threshold and means for reducing the sound output level of the amplifier in response to a signal from the distortion sensing means, characterised in that the reference threshold of the distortion sensing means is varied in dependence upon the output level setting of the volume control.

2. An audio system as claimed in claim 1, wherein the reference threshold of the distortion sensing means is varied in discrete steps as a function of the volume control setting.

3. An audio system as claimed in claim 2, wherein reference threshold of the distortion sensing means can adopt one of only two values, depending upon whether the setting of the volume control is above or below a given limit.

* * * * *